(12) United States Patent
Tsukizawa et al.

(10) Patent No.: US 9,516,728 B2
(45) Date of Patent: *Dec. 6, 2016

(54) ESD PROTECTION DEVICE

(71) Applicant: Murata Manufacturing Co., Ltd., Kyoto (JP)

(72) Inventors: Takayuki Tsukizawa, Kyoto (JP); Jun Adachi, Kyoto (JP); Katumi Yasunaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 153 days.

This patent is subject to a terminal disclaimer.

(21) Appl. No.: 14/484,357

(22) Filed: Sep. 12, 2014

(65) Prior Publication Data

US 2014/0376147 A1 Dec. 25, 2014

Related U.S. Application Data

(63) Continuation of application No. PCT/JP2013/056466, filed on Mar. 8, 2013.

(30) Foreign Application Priority Data

Mar. 28, 2012 (JP) .................................. 2012-074220

(51) Int. Cl.
*H02H 9/00* (2006.01)
*H05F 3/04* (2006.01)
(Continued)

(52) U.S. Cl.
CPC .................. *H05F 3/04* (2013.01); *H01T 1/22* (2013.01); *H01T 4/12* (2013.01); *H05K 1/026* (2013.01)

(58) Field of Classification Search
CPC ........................................................ H05F 3/04
(Continued)

(56) References Cited

U.S. PATENT DOCUMENTS 8,426,889 B2 * 4/2013 Adachi ..................... H01T 4/12
257/173
9,117,834 B2 * 8/2015 Sumi ......................... H01T 1/20
(Continued)

FOREIGN PATENT DOCUMENTS

JP          63-79087 U    5/1988
JP          09-223566 A   8/1997
(Continued)

OTHER PUBLICATIONS

International Search Report issued in Application No. PCT/JP2013/056466 dated May 14, 2013.
(Continued)

*Primary Examiner* — Stephen W Jackson
(74) *Attorney, Agent, or Firm* — Pearne & Gordon LLP

(57) ABSTRACT

An ESD protection device 1 includes an insulating member 10, first and second discharge electrodes 21 and 22, a first outer electrode 31, a second outer electrode 32, and inner conductors 41 and 42. The first and second discharge electrodes 21 and 22 are provided in the insulating member 10. The first outer electrode 31 is provided on an outer surface of the insulating member 10. The first outer electrode 31 is electrically connected to the first discharge electrode 21. The second outer electrode 32 is provided on an outer surface of the insulating member 10. The second outer electrode 32 is electrically connected to the second discharge electrode 22. The inner conductors 41 and 42 are provided in the insulating member 10. The inner conductors 41 and 42 are connected to the first outer electrode 31 or the second outer electrode 32.

20 Claims, 7 Drawing Sheets

(51) Int. Cl.
 *H01T 4/12* (2006.01)
 *H01T 1/22* (2006.01)
 *H05K 1/02* (2006.01)

(58) Field of Classification Search
 USPC ............................................. 361/112
 See application file for complete search history.

(56) References Cited

U.S. PATENT DOCUMENTS 9,230,723 B2 * 1/2016 Kato ................ H01F 17/0013
2011/0222197 A1 9/2011 Adachi

FOREIGN PATENT DOCUMENTS

| | | |
|---|---|---|
| JP | 2000-243534 A | 9/2000 |
| JP | 2010-146779 A | 7/2010 |
| JP | 2011-187439 A | 9/2011 |
| WO | 2008-146514 A1 | 12/2008 |
| WO | 2010/061550 A1 | 6/2010 |

OTHER PUBLICATIONS

Written Opinion issued in Application No. PCT/JP2013/056466 dated May 14, 2013.

\* cited by examiner

ESD PROTECTION DEVICE

BACKGROUND OF THE INVENTION

1. Field of the Invention

The present invention relates to an ESD protection device.

2. Description of the Related Art

Hitherto, various types of ESD protection devices have been proposed for reducing the occurrence of the breakdown of an electronic device caused by electrostatic discharge (ESD: electro-static discharge). For example, Patent Document 1 describes an ESD protection device provided with a ceramic multilayer substrate and a pair of discharge electrodes arranged in the ceramic multilayer substrate, the pair of discharge electrodes being arranged so as to be spaced apart in a cavity portion provided in the ceramic multilayer substrate such that ends of the discharge electrodes face each other.

Patent Document 1: WO2008/146514A1

BRIEF SUMMARY OF THE INVENTION

An ESD protection device is deteriorated by heat caused when an electric discharge occurs. In light of this, it is desired to improve the heat dissipation capability of an ESD protection device.

It is a main object of the present invention to provide an ESD protection device having a superior heat dissipation capability.

An ESD protection device according to the present invention includes an insulating member, first and second discharge electrodes, a first outer electrode, a second outer electrode, and one or more inner conductors. The first and second discharge electrodes are provided in the insulating member. The first outer electrode is provided on an outer surface of the insulating member. The first outer electrode is electrically connected to the first discharge electrode. The second outer electrode is provided on an outer surface of the insulating member. The second outer electrode is electrically connected to the second discharge electrode. The inner conductors are provided in the insulating member. The inner conductors are connected to the first or second outer electrode.

In a certain specific aspect of the ESD protection device according to the present invention, the first discharge electrode and the second discharge electrode are provided so as to face each other. The inner conductors are provided so as to overlie, in a planar view, a portion where the first discharge electrode faces the second discharge electrode.

In another specific aspect of the ESD protection device according to the present invention, the insulating member includes a cavity. An end portion of the first discharge electrode and an end portion of the second discharge electrode are each positioned in the cavity.

In another specific aspect of the ESD protection device according to the present invention, the inner conductors include an inner conductor connected to the first discharge electrode and an inner conductor connected to the second discharge electrode. The inner conductors are arranged such that an end portion of the inner conductors connected to the first discharge electrode faces an end portion of the inner conductor connected to the second discharge electrode.

In another specific aspect of the ESD protection device according to the present invention, the inner conductors are provided so as to overlie the cavity in a planar view.

In another specific aspect of the ESD protection device according to the present invention, a plurality of the inner conductors are provided with a spacing therebetween along a thickness direction of the insulating member.

In another specific aspect of the ESD protection device according to the present invention, the insulating member includes first and second main surfaces, first and second side surfaces, and first and second end surfaces. The first outer electrode includes a first portion provided on the first end surface and a second portion provided on at least one of the first and second main surfaces. The second outer electrode includes a third portion provided on the second end surface and a fourth portion provided on at least one of the first and second main surfaces.

In another specific aspect of the ESD protection device according to the present invention, the inner conductors include a first inner conductor connected to the first portion and a second inner conductor connected to the third portion.

In another specific aspect of the ESD protection device according to the present invention, at least one of the second and fourth portions is provided so as to overlie the cavity in a planar view.

In another specific aspect of the ESD protection device according to the present invention, the ESD protection device further includes a discharge supporting electrode. The discharge supporting electrode is arranged between an end portion of the first discharge electrode and an end portion of the second discharge electrode. The discharge supporting electrode decreases a discharge start voltage between the first discharge electrode and the second discharge electrode. The ESD protection device further includes a protection layer. The protection layer is arranged between the insulating member and an end portion of at least one of the first and second discharge electrodes.

In another specific aspect of the ESD protection device according to the present invention, the protection layer includes at least one selected from among a group of alumina, mullite, zirconia, magnesia, and quartz.

According to the present invention, there may be provided an ESD protection device having a superior heat dissipation capability.

DETAILED DESCRIPTION OF THE INVENTION

Figure 1:
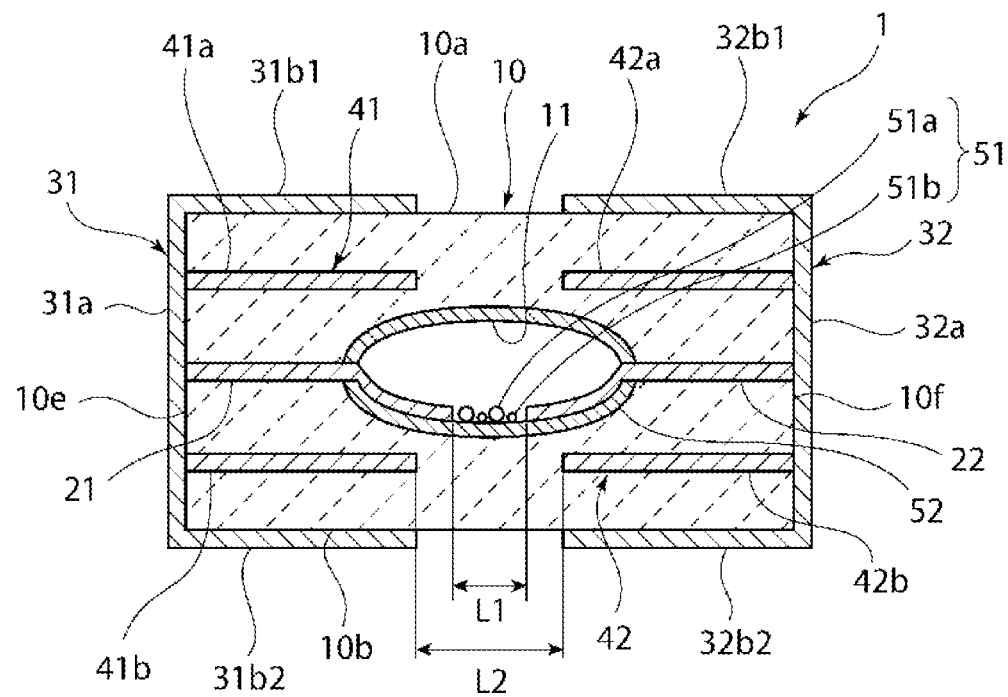
FIG. 1 is a schematic cross-sectional view of an ESD protection device according to an embodiment of the present invention.

The following illustrates an example of a preferred embodiment of the present invention. Note that the following embodiment is a mere example. The present invention is not limited to the following embodiment at all.

In addition, parts having a substantially identical function are denoted by the same reference numerals in the drawings to which the reference is made in the embodiment or the like. In addition, the drawings to which the reference is made in the embodiment or the like are schematically illustrated, and the ratio of the dimensions or the like of an object illustrated in the drawings may differ from the ratio of the dimensions or the like of an actual object. The ratio of the dimensions or the like of an object may differ from one drawing to another drawing. A specific ratio of the dimensions or the like of an object should be determined by taking the following description into consideration.

Figure 2:
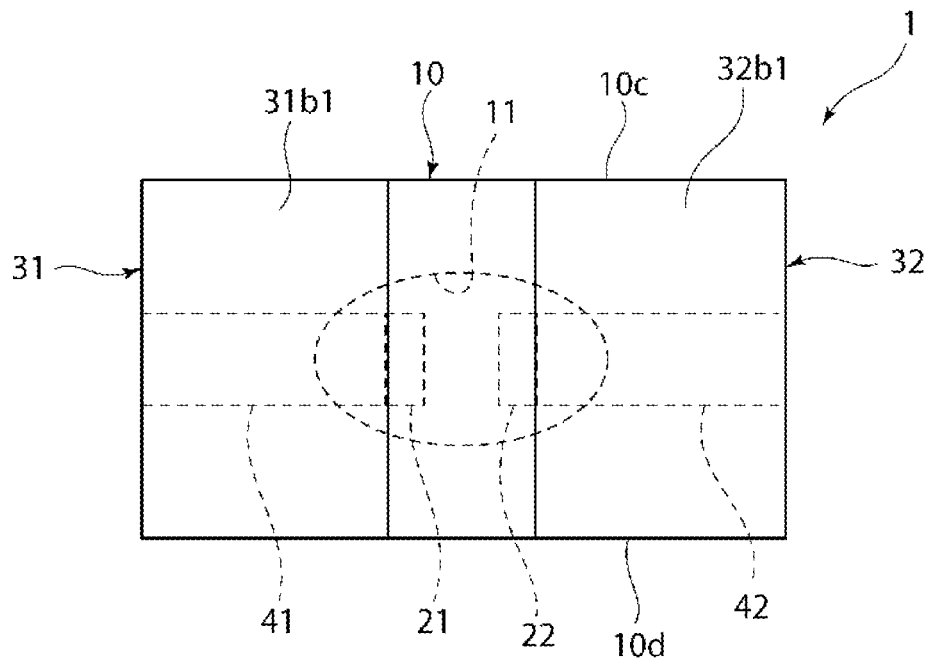
FIG. 2 is a schematic plan view of the ESD protection device according to the embodiment of the present invention.

FIG. 1 is a schematic cross-sectional view of an ESD protection device according to the present embodiment. FIG. 2 is a schematic plan view of an ESD protection device according to the present embodiment.

As illustrated in FIG. 1 and FIG. 2, an ESD protection device 1 includes an insulating member 10 having a cavity 11. The insulating member 10 is a hexahedron. Here, a "hexahedron" refers to a general three-dimensional object having six surfaces. Each of the six surfaces of a hexahedron may not be a flat surface. Facing surfaces among the surfaces of a hexahedron may be or may not be parallel to each other. The corner portions and edge line portions of a hexahedron may each be chamfered or may each have a rounded form. In the present embodiment, specifically, the insulating member 10 is provided in a substantially rectangular parallelepiped shape. The insulating member 10 includes first and second main surfaces 10a and 10b, first and second side surfaces 10c and 10d, and first and second end surfaces 10e and 10f. The first and second main surfaces 10a and 10b are parallel to each other. The first and second side surfaces 10c and 10d are parallel to each other. The first and second end surfaces 10e and 10f are parallel to each other.

The insulating member 10 may be constituted by an appropriate ceramic. Specifically, the insulating member 10 may be constituted by, for example, a Low Temperature Co-fired Ceramic (LTCC: Low Temperature Co-fired Ceramics), which includes Ba, Al, and Si as principal components. Note that a resin substrate including, for example, a polyimide resin, an epoxy resin, or the like may be used as the insulating member 10.

First and second discharge electrodes 21 and 22 are provided inside the insulating member 10. Each of the first and second discharge electrodes 21 and 22 is provided so as to be parallel to the first and second main surfaces 10a and 10b. The first discharge electrode 21 extends to the first end surface 10e. In contrast, the second discharge electrode 22 extends to the second end surface 10f. An end portion of the first discharge electrode 21 and an end portion of the second discharge electrode 22 are positioned in the cavity 11. The end portion of the first discharge electrode 21 faces the end portion of the second discharge electrode 22 in the cavity 11. With such a configuration, the responsivity of the ESD protection device 1 may be improved and the durability of the ESD protection device 1 may also be improved.

First and second outer electrodes 31 and 32 are provided on an outer surface of the insulating member 10. Specifically, the first outer electrode 31 includes a first portion 31a provided on the first end surface 10e, and second portions 31b1 and 31b2 provided on at least one of the first and second main surfaces 10a and 10b. The first outer electrode may also be provided only on the first end surface. The first outer electrode 31 is electrically connected to the first discharge electrode 21 at the first portion 31a.

The second outer electrode 32 includes a third portion 32a provided on the second end surface 10f, and fourth portions 32b1 and 32b2 provided on at least one of the first and second main surfaces 10a and 10b. The second outer electrode may also be provided only on the second end surface. The second outer electrode 32 is electrically connected to the second discharge electrode 22 at the third portion 32a.

On an inner surface of the cavity 11, a discharge supporting electrode 51 is arranged between the end portion of the first discharge electrode 21 and the end portion of the second discharge electrode 22. A discharge supporting electrode may also be provided between the first and second discharge electrodes and the insulating member 10 in addition to between the end portion of the first discharge electrode and the end portion of the second discharge electrode.

The discharge supporting electrode 51 has a function of reducing a discharge start voltage. Specifically, by providing the discharge supporting electrode 51, a discharge through the discharge supporting electrode 51 occurs in addition to a surface discharge and a gaseous discharge. Normally, among a surface discharge, a gaseous discharge, and a discharge through the discharge supporting electrode 51, the discharge through the discharge supporting electrode 51 has the lowest discharge start voltage. Thus, a discharge start voltage may be decreased by providing the discharge supporting electrode 51. As a result, the occurrence of an electrical breakdown of the ESD protection device 1 may be reduced. In addition, the responsivity of the ESD protection device 1 may be improved by providing the discharge supporting electrode 51.

The discharge supporting electrode 51 may be composed of, for example, a particle dispersion element in which a plurality of metal particles 51a whose surfaces coated with an inorganic material having no conductivity and a plurality of semiconductor ceramic particles 51b are dispersed. In this case, the discharge supporting electrode 51 may be formed by applying and firing a paste including, for example, a plurality of metal particles 51a whose surfaces are coated with an inorganic material having no conductivity and a plurality of semiconductor ceramic particles 51b.

The metal particles 51a are composed of, for example, Cu, Ni, or the like. The diameter of a metal particle 51a may be, for example, about 2 μm to 3 μm. A coating film of the metal particle 51a may be composed of, for example, aluminum oxide or the like.

The semiconductor ceramic particles 51b are composed of, for example, a carbide such as silicon carbide, titanium carbide, zirconium carbide, molybdenum carbide, tungsten carbide, or the like; a nitride such as titanium nitride, zirconium nitride, chromium nitride, vanadium nitride, tantalum nitride, or the like; a silicide such as titanium silicide, zirconium silicide, tungsten silicide, molybdenum silicide, chromium silicide, or the like; a boride such as titanium boride, zirconium boride, chromium boride, lanthanum boride, molybdenum boride, tungsten boride, or the like; an oxide such as zinc oxide, strontium titanate, or the like; or the like.

The discharge supporting electrode 51 may further include insulating particles composed of aluminum oxide or the like, in addition to the metal particles 51a and the semiconductor ceramic particles 51b.

A protection layer 52 is provided between the insulating member 10 and the end portion of at least one of the first and second discharge electrodes 21 and 22. Specifically, the protection layer 52 is provided so as to cover substantially the entirety of an inner wall of the cavity 11. Components included in the insulating member 10 may be less likely to reach the end portion by providing this protection layer 52. Thus, the discharge characteristics of the ESD protection device 1 may be less likely to be degraded by the degradation of the first and second discharge electrodes 21 and 22.

Preferably, the protection layer 52 is composed of a ceramic having a higher sintering temperature than the ceramic of which the insulating member 10 is composed. Preferably, the protection layer 52 includes at least one selected from a group consisting of, for example, alumina, mullite, zirconia, magnesia, and quartz. First and second inner conductors 41 and 42 are provided in the insulating member 10. An end portion of the first inner conductor 41 faces an end portion of the second inner conductor 42. Since the end portion of the first inner conductor 41 faces the end portion of the second inner conductor 42, the generated heat may be dissipated by the first outer electrode and the second outer electrode in a well-balanced manner. Thus, the heat may be more efficiently dissipated. A distance L2 between the end portion of the first inner conductor 41 and the end portion of the second inner conductor 42 is greater than a distance L1 between the end portion of the first discharge electrode 21 and the end portion of the second discharge electrode 22. Preferably, L2 is two or more times greater than L1. More preferably, L2 is three or more times greater than L1. This is because a discharge occurs between the inner conductors 41 and 42 when L2 is too small.

The first inner conductor 41 extends to the first end surface 10e. The first inner conductor 41 is connected to the first portion 31a of the first outer electrode 31. The first inner conductor 41 includes a first inner conductor 41a and a first inner conductor 41b, the first inner conductors 41a and 41b being positioned on one side and the other side, respectively, in the thickness direction of the cavity 11. That is, the first inner conductors 41a and 41b are provided on both sides in the thickness direction of the cavity 11. A plurality of first inner conductors 41a and a plurality of first inner conductors 41b may also be provided with a spacing therebetween in the thickness direction.

The second inner conductor 42 extends to the second end surface 10f. The second inner conductor 42 is connected to the third portion 32a of the second outer electrode 32. The second inner conductor 42 includes a second inner conductor 42a and a second inner conductor 42b, the second inner conductors 42a and 42b being positioned on one side and the other side, respectively, in the thickness direction of the cavity 11. That is, the second inner conductors 42a and 42b are provided on both sides in the thickness direction of the cavity 11. A plurality of second inner conductors 42a and a plurality of second inner conductors 42b may also be provided with a spacing therebetween in the thickness direction.

At least one of the first and second inner conductors 41 and 42 is provided so as to overlie the cavity 11 in a planar view (when viewed in the thickness direction). Likewise, each of the second portions 31b1 and 31b2 and the fourth portions 32b1 and 32b2 is provided so as to overlie the cavity 11 in a planar view.

Note that the first and second discharge electrodes 21 and 22, the first and second outer electrodes 31 and 32, and the first and second inner conductors 41 and 42 may each be composed of, for example, a metal (including an alloy) including at least one of Cu, Ag, Pd, Pt, Al, Ni, and W. Preferably, the first and second discharge electrodes 21 and 22, the first and second outer electrodes 31 and 32, and the first and second inner conductors 41 and 42 are composed of identical material.

As described above, in the present embodiment, there is provided the first and second inner conductors 41 and 42 having a higher thermal conductivity than the insulating member 10. Thus, the heat of the insulating member 10 tends to be dissipated through the first and second inner conductors 41 and 42 and the first and second outer electrodes 31 and 32. Thus, the ESD protection device 1 having an improved heat dissipation capability may be realized.

In particular, in the present embodiment, at least one of the first and second inner conductors 41 and 42 is provided so as to overlie the cavity 11 in a planar view. Thus, the heat of a portion of the cavity 11 that tends to generate the heat may be efficiently dissipated.

Furthermore, by providing the first and second outer electrodes 31 and 32 with the second and fourth portions 31b1, 31b2, 32b1, and 32b2, the surface area of the first and second outer electrodes 31 and 32 may be increased. Thus, the heat may be more efficiently dissipated.

In particular, in the present embodiment, the second and fourth portions 31b1, 31b2, 32b1, and 32b2 are provided so as to overlie the cavity 11 in a planar view. Thus, the heat of a portion of the cavity 11 that tends to generate the heat may be more efficiently dissipated.

In addition, by providing the inner conductors 41 and 42, a crack caused by contraction may be less likely to occur when the ESD protection device 1 is manufactured by firing.

Note that the shape of the inner conductors 41 and 42 is not limited to that illustrated in FIGS. 1 and 2.

Figure 3:
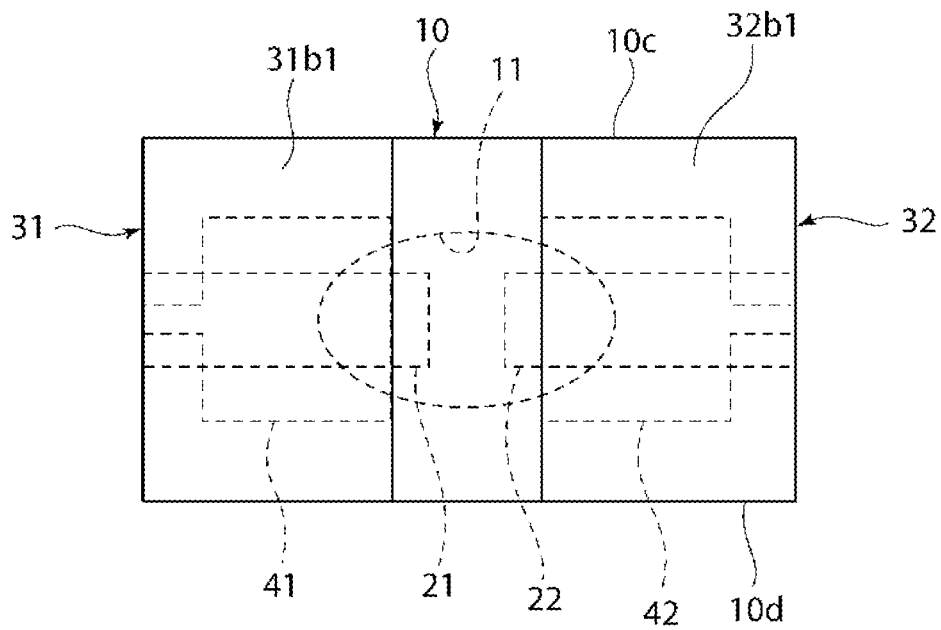
FIG. 3 is a schematic plan view of an ESD protection device according to a first modified example.

For example, as illustrated in FIG. 3, there may be provided the inner conductors 41 and 42 that are tapered on the side where the end surfaces 10e and 10f are provided and that are widened on the center side.

Figure 4:
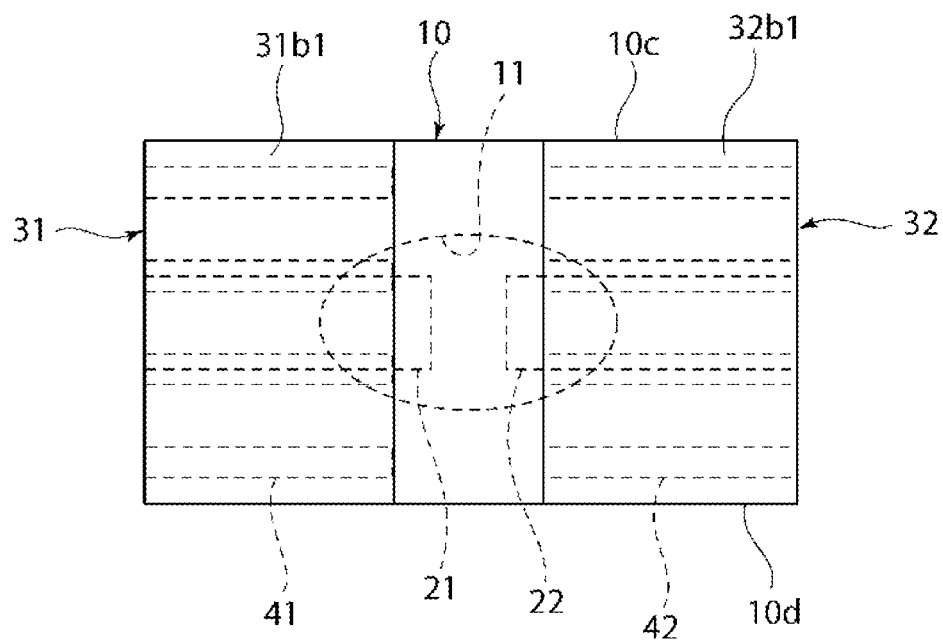
FIG. 4 is a schematic plan view of an ESD protection device according to a second modified example.

As illustrated in FIG. 4, there may be provided a plurality of the inner conductors 41 and 42 arranged along the width direction.

Figure 5:
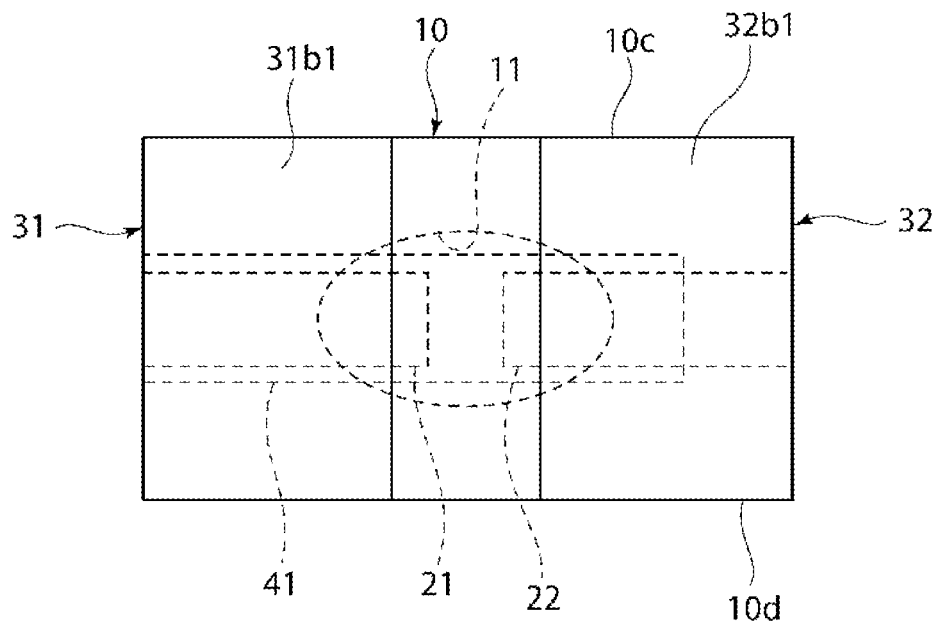
FIG. 5 is a schematic plan view of an ESD protection device according to a third modified example.

As illustrated in FIG. 5, there may be provided an inner conductor 41 such that the inner conductor 41 traverses the cavity 11. In that case, in a planar view, the inner conductor 41 overlies a portion where the end portion of the first discharge electrode 21 faces the end portion of the second discharge electrode 22. Thus, the heat of a portion of the cavity 11 that tends to generate the heat may be more efficiently dissipated.

Figure 6:
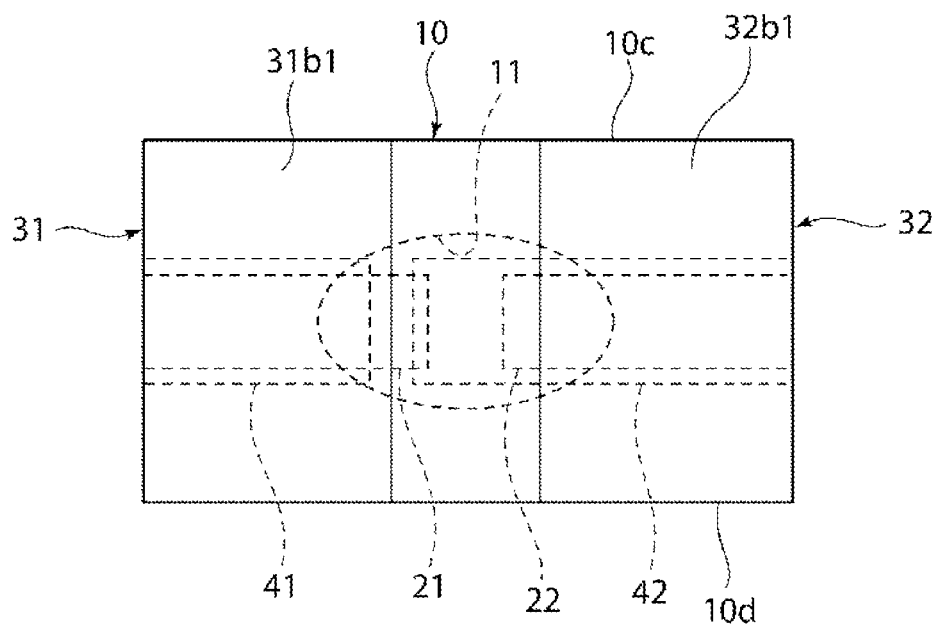
FIG. 6 is a schematic plan view of an ESD protection device according to a fourth modified example.

As illustrated in FIG. 6, one of the inner conductors 41 and 42 may be made longer than the other.

Figure 7:
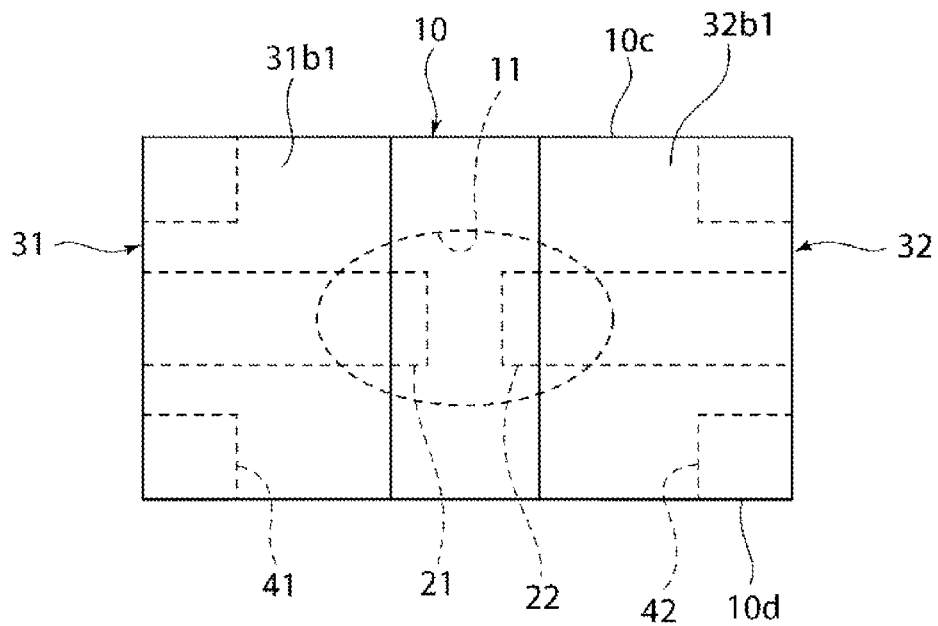
FIG. 7 is a schematic plan view of an ESD protection device according to a fifth modified example.
Figure 8:
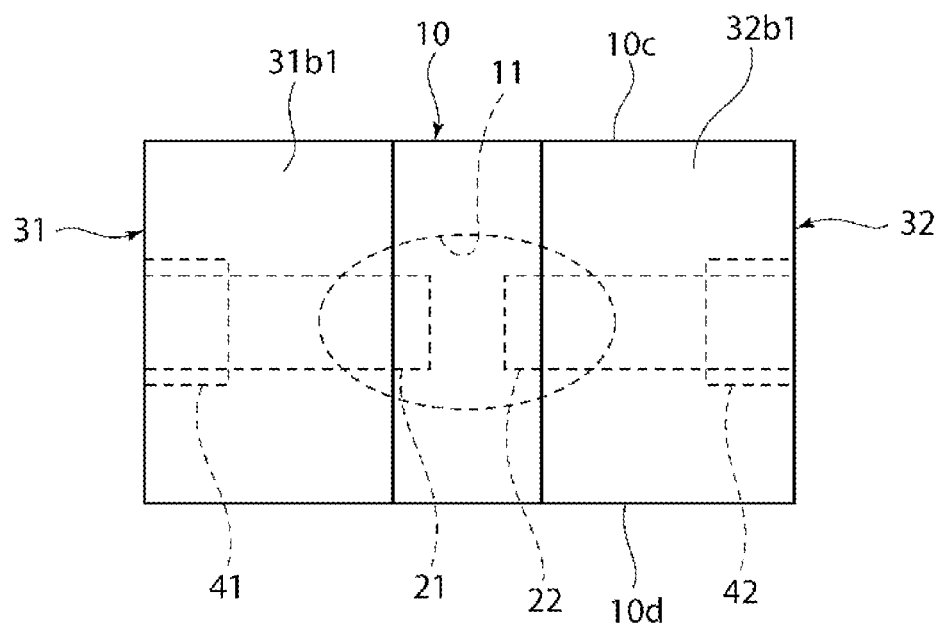
FIG. 8 is a schematic plan view of an ESD protection device according to a sixth modified example.

As illustrated in FIG. 7 or 8, the inner conductors 41 and 42 may be provided so as not to overlie the cavity 11. In an example illustrated in FIG. 7, the inner conductors 41 and 42 are provided at the four corners of the insulating member 10.

Figure 9:
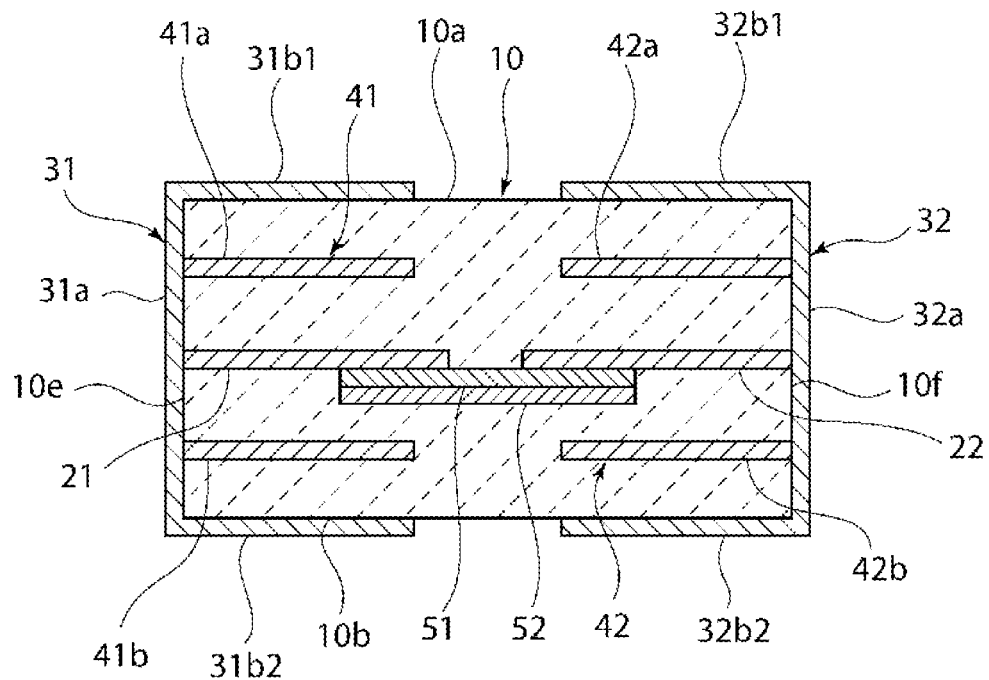
FIG. 9 is a schematic cross-sectional view of an ESD protection device according to a seventh modified example.

Note that, as illustrated in FIG. 9, the insulating member 10 does not have to be provided with a cavity.

In the above-described embodiment, an example has been described in which the end portion of the first discharge electrode 21 faces the end portion of the second discharge electrode 22 in a direction in which the discharge electrodes 21 and 22 extend (in a length direction L). Note that the present invention is not limited to this configuration. For example, as illustrated in FIGS. 10 to 13, the end portion of the first discharge electrode 21 does not have to face the end portion of the second discharge electrode 22 in the direction in which the discharge electrodes 21 and 22 extend (in the length direction L).

Figure 10:
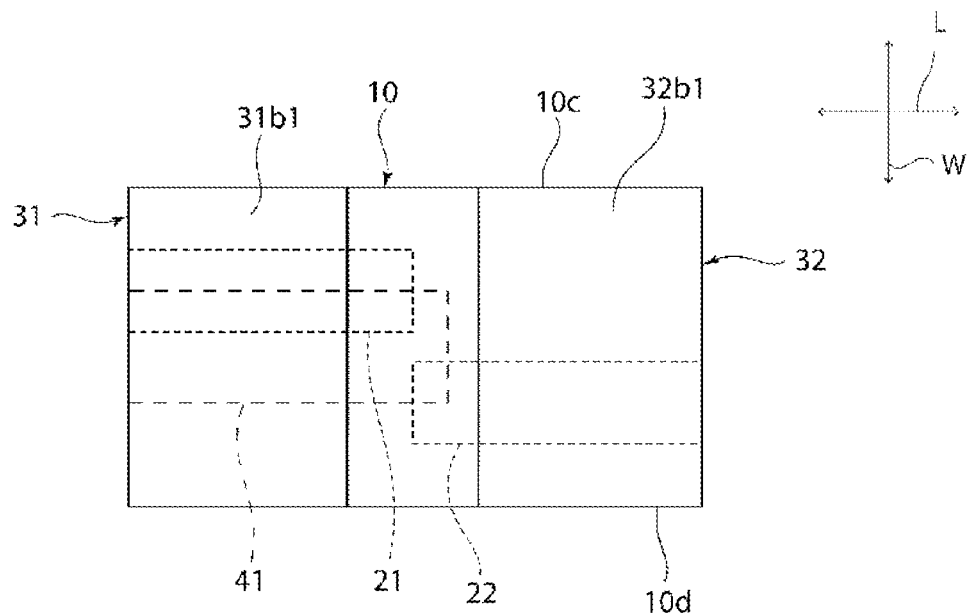
FIG. 10 is a schematic plan view of an ESD protection device according to an eighth modified example.

In an example illustrated in FIG. 10, the position of the end portion of the first discharge electrode 21 in a width direction W differs from the position of the end portion of the second discharge electrode 22 in the width direction W. The position of the end portion of the first discharge electrode 21 in the length direction L is substantially the same as the position of the end portion of the second discharge electrode 22 in the length direction L. Thus, a corner portion of the first discharge electrode 21 on one side in the width direction W faces a corner portion of the second discharge electrode 22 on the other side in the width direction W.

Figure 11:
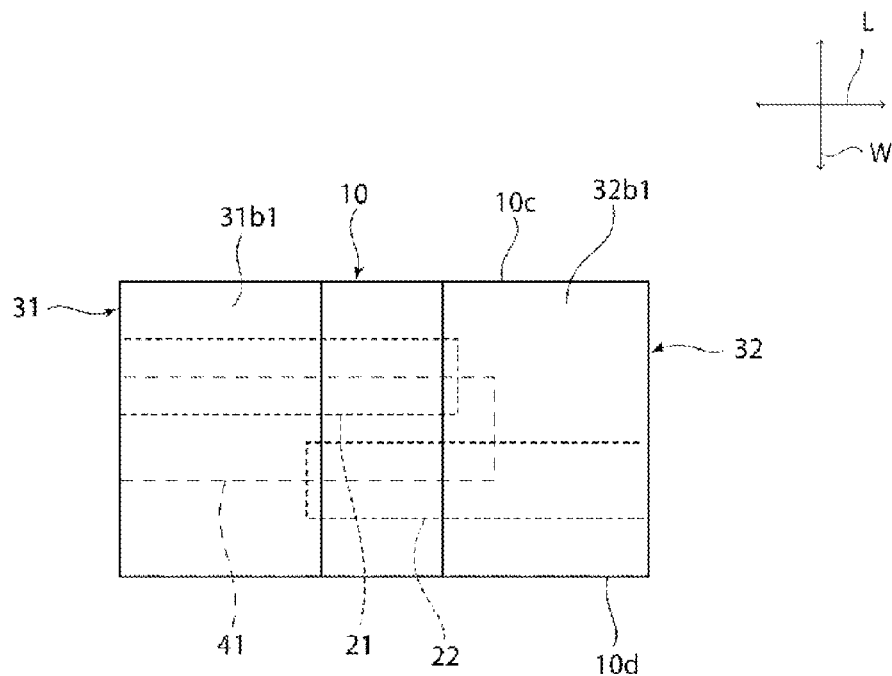
FIG. 11 is a schematic plan view of an ESD protection device according to a ninth modified example.
Figure 12:
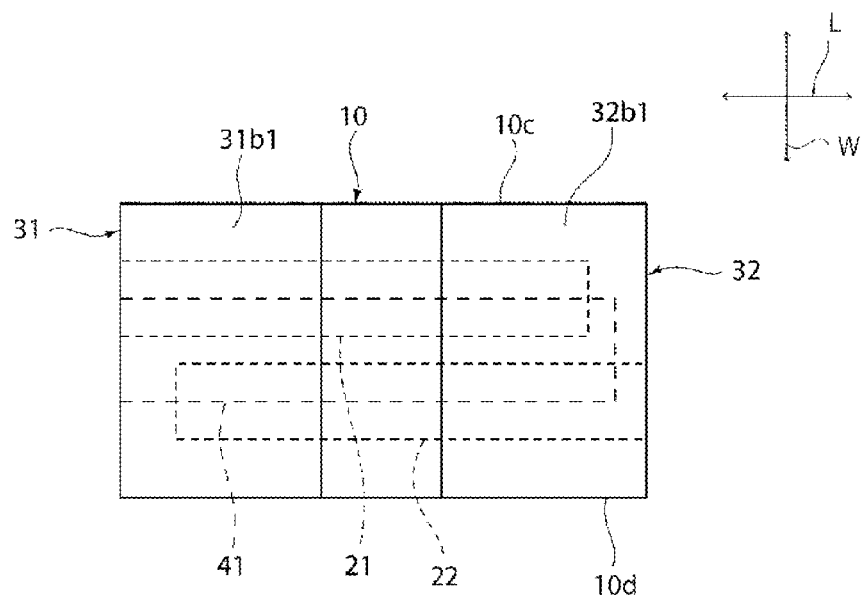
FIG. 12 is a schematic plan view of an ESD protection device according to a tenth modified example.

In examples illustrated in FIGS. 11 and 12, also, the position of the end portion of the first discharge electrode 21 in the width direction W differs from the position of the end portion of the second discharge electrode 22 in the width direction W. A portion of the first discharge electrode 21 faces a portion of the second discharge electrode 22 in the width direction W.

Figure 13:
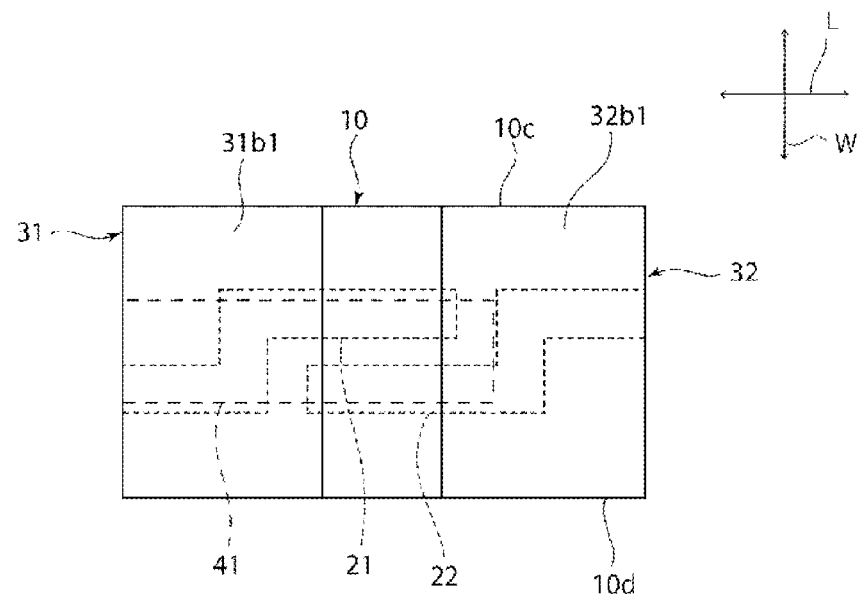
FIG. 13 is a schematic plan view of an ESD protection device according to an eleventh modified example.

Likewise, also, in an example illustrated in FIG. 13, a portion of the first discharge electrode 21 faces a portion of the second discharge electrode 22 in the width direction W. The minimum distance of a portion where the first discharge electrode 21 and the second discharge electrode 22 face each other in the width direction W is shorter than the distance between the end portion of the first discharge electrode 21 and the second discharge electrode 22 in the length direction L and is shorter than the distance between the end portion of the second discharge electrode 22 and the first discharge electrode 21 in the length direction L. Thus, a discharge occurs in the portion where the first discharge electrode 21 and the second discharge electrode 22 face each other in the width direction W.

(Example 1)

Under the following conditions, an ESD protection device was manufactured that has a configuration substantially similar to that of the ESD protection device 1 according to the above-described embodiment.

A ceramic used as a component of an insulating member: BAS material mainly including Ba, Al, and Si Discharge electrodes, outer electrodes, inner conductors: Cu The dimensions of the ESD protection device: length 1.0 mm×width 0.5 mm×thickness 0.3 mm The shape of a cavity in a planar view: rectangular The length of the cavity: 200 μm The distance L2: 100 μm (each of the first and second inner conductors overlies the cavity by (250 μm−100 μm)/2=50 μm.)

Second and fourth portions of the first and second outer electrodes: none (Example 2)

Except that each of the second and fourth portions of the first and second outer electrodes was provided so as to have the same length as the first or second inner conductor, an ESD protection device was manufactured similarly as in Example 1.

(Example 3)

Except that the distance L2 was set to 500 μm and each of the first and second inner conductors did not overlie the cavity, an ESD protection device was manufactured similarly as in Example 1.

(Example 4)

Except that the distance L2 was set to 500 μm, that each of the first and second inner conductors did not overlie the cavity, and that the second and fourth portions were made to have the same length as the first or second inner conductor, an ESD protection device was manufactured similarly as in Example 2.

(Example 5)

As illustrated in FIG. 5, except that an inner conductor was formed that traverses the cavity, an ESD protection device was manufactured similarly as in Example 1.

(Example 6)

As illustrated in FIG. 5, except that an inner conductor traversing the cavity was formed and a second portion similar to the inner conductor was provided, an ESD protection device was manufactured similarly as in Example 2.

(Comparison Example)

Except that no inner conductors were formed, an ESD protection device was manufactured similarly as in Example 1.

(Evaluation of ESD Repetition Resistance)

Application of 8 kV was performed the number of times illustrated in Table 1 in a contact discharge, and then an ESD discharge responsivity was evaluated. The ESD discharge responsivity was evaluated in the electrostatic discharge immunity test, which was defined by IEC61000-4-2, an IEC standard. In the case where 8 kV was applied in a contact discharge, it was checked whether or not a discharge occurred between discharge electrodes of a sample. When a peak voltage detected on a protection circuit side exceeded 700 V, the ESD repetition resistance was determined to be poor (marked with X). When the peak voltage was between 600 V to 700 V, the ESD repetition resistance was determined to be (marked with Δ). When the peak voltage was between 450 V to 600 V, the ESD repetition resistance was determined to be good (marked with O). When the peak voltage was lower than 450 V, the ESD repetition resistance was determined to be very good (marked with ◎).

The results are illustrated in the following Table 1.

TABLE 1

| | Inner Conductor | Second and Fourth Portions | Evaluation of ESD Repetition Resistance | |
|---|---|---|---|---|
| | | | 500th Time | 1000th Time |
| Example 1 | Present | Absent | ◎ | O |
| Example 2 | Present | Present | ◎ | ◎ |
| Example 3 | Present | Absent | O | O |
| Example 4 | Present | Present | ◎ | O |
| Example 5 | Present | Absent | ◎ | ◎ |
| Example 6 | Present | Present | ◎ | ◎ |
| Comparison Example | Absent | Absent | Δ | Δ |

It is clear from the results illustrated in Table 1 that the ESD repetition resistance is improved by providing an inner conductor. Furthermore, it is clear that the ESD repetition resistance is further improved by providing the second and fourth portions. In addition, it is clear that the ESD repetition resistance is further improved by overlaying the inner conductors and the cavity.

1 . . . ESD protection device
10 . . . insulating member
10a . . . first main surface
10b . . . second main surface
10c . . . first side surface
10d . . . second side surface
10e . . . first end surface
10f . . . second end surface
11 . . . cavity
21 . . . first discharge electrode
22 . . . second discharge electrode
31 . . . first outer electrode
31a . . . first portion
31b1, 31b2 . . . second portion
32 . . . second outer electrode
32a . . . third portion
32b1, 32b2 . . . fourth portion
41, 41a, 41b . . . first inner conductor
42, 42a, 42b . . . second inner conductor
51 . . . discharge supporting electrode
51a . . . metal particle
51b . . . semiconductor ceramic particle
52 . . . protection layer

The invention claimed is:

1. An ESD protection device comprising:
an insulating member;
first and second discharge electrodes provided in the insulating member;
a first outer electrode provided on an outer surface of the insulating member and electrically connected to the first discharge electrode;
a second outer electrode provided on an outer surface of the insulating member and electrically connected to the second discharge electrode; and
one or more inner conductors provided in the insulating member and connected to the first or second outer electrode.

2. The ESD protection device according to claim 1, wherein the first discharge electrode and the second discharge electrode are provided so as to face each other, and
the inner conductors are provided so as to overlie, in a planar view, a portion where the first discharge electrode faces the second discharge electrode.

3. The ESD protection device according to claim 1, wherein the insulating member includes a cavity, and
an end portion of the first discharge electrode and an end portion of the second discharge electrode are each positioned in the cavity.

4. The ESD protection device according to claim 3, wherein the inner conductors are provided so as to overlie the cavity in a planar view.

5. The ESD protection device according to claim 1, wherein the inner conductors include an inner conductor connected to the first discharge electrode and an inner conductor connected to the second discharge electrode are included, and
the inner conductors are arranged such that an end portion of the inner conductors connected to the first discharge electrode faces an end portion of the inner conductors connected to the second discharge electrode.

6. The ESD protection device according to claim 1, wherein a plurality of the inner conductors are provided with a spacing therebetween along a thickness direction of the insulating member.

7. The ESD protection device according to claim 1, wherein the insulating member includes first and second main surfaces, first and second side surfaces, and first and second end surfaces,
the first outer electrode includes a first portion provided on the first end surface and a second portion provided on at least one of the first and second main surfaces, and
the second outer electrode includes a third portion provided on the second end surface and a fourth portion provided on at least one of the first and second main surfaces.

8. The ESD protection device according to claim 7, wherein the inner conductors include a first inner conductor connected to the first portion and a second inner conductor connected to the third portion.

9. The ESD protection device according to claim 3, wherein at least one of the second and fourth portions is provided so as to overlie the cavity in a planar view.

10. The ESD protection device according to claim 1, further comprising: a discharge supporting electrode arranged between an end portion of the first discharge electrode and an end portion of the second discharge electrode and decreasing a discharge start voltage between the first discharge electrode and the second discharge electrode.

11. The ESD protection device according to claim 1, further comprising: a protection layer arranged between the insulating member and an end portion of at least one of the first and second discharge electrodes.

12. The ESD protection device according to claim 11, wherein the protection layer includes at least one selected from among a group of alumina, mullite, zirconia, magnesia, and quartz.

13. The ESD protection device according to claim 2, wherein the insulating member includes a cavity, and
an end portion of the first discharge electrode and an end portion of the second discharge electrode are each positioned in the cavity.

14. The ESD protection device according to claim 2, wherein the inner conductors include an inner conductor connected to the first discharge electrode and an inner conductor connected to the second discharge electrode are included, and
the inner conductors are arranged such that an end portion of the inner conductors connected to the first discharge electrode faces an end portion of the inner conductors connected to the second discharge electrode.

15. The ESD protection device according to claim 3, wherein the inner conductors include an inner conductor connected to the first discharge electrode and an inner conductor connected to the second discharge electrode are included, and
the inner conductors are arranged such that an end portion of the inner conductors connected to the first discharge electrode faces an end portion of the inner conductors connected to the second discharge electrode.

16. The ESD protection device according to claim 4, wherein the inner conductors include an inner conductor connected to the first discharge electrode and an inner conductor connected to the second discharge electrode are included, and
the inner conductors are arranged such that an end portion of the inner conductors connected to the first discharge electrode faces an end portion of the inner conductors connected to the second discharge electrode.

17. The ESD protection device according to claim 2, wherein a plurality of the inner conductors are provided with a spacing therebetween along a thickness direction of the insulating member.

18. The ESD protection device according to claim 3, wherein a plurality of the inner conductors are provided with a spacing therebetween along a thickness direction of the insulating member.

19. The ESD protection device according to claim 4, wherein a plurality of the inner conductors are provided with a spacing therebetween along a thickness direction of the insulating member.

20. The ESD protection device according to claim 5, wherein a plurality of the inner conductors are provided with a spacing therebetween along a thickness direction of the insulating member.

* * * * *